(12) United States Patent
Gao

(10) Patent No.: US 10,327,359 B1
(45) Date of Patent: Jun. 18, 2019

(54) COUPLING DESIGNS FOR A DATA CENTER BUILDING USING INDIRECT EVAPORATIVE COOLING (IDEC) UNITS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 15/967,092

(22) Filed: Apr. 30, 2018

(51) Int. Cl.
*H05K 7/14* (2006.01)
*H05K 7/20* (2006.01)
*H05K 7/18* (2006.01)

(52) U.S. Cl.
CPC ....... *H05K 7/20663* (2013.01); *H05K 7/1487* (2013.01); *H05K 7/1488* (2013.01); *H05K 7/1497* (2013.01); *H05K 7/18* (2013.01); *H05K 7/207* (2013.01); *H05K 7/20827* (2013.01)

(58) Field of Classification Search
CPC .......................... H05K 7/1497; H05K 7/20827
See application file for complete search history.

(56) References Cited

U.S. PATENT DOCUMENTS

| | | | | |
|---|---|---|---|---|
| 8,514,572 | B2 * | 8/2013 | Rogers | H05K 7/20745 361/695 |
| 9,069,534 | B2 * | 6/2015 | Rogers | H05K 7/20745 |
| 9,237,681 | B2 * | 1/2016 | Slessman | H05K 7/20745 |
| 9,310,855 | B2 * | 4/2016 | Godrich | G06F 1/20 |
| 9,510,485 | B2 * | 11/2016 | Schmitt | H05K 7/20745 |
| 9,661,788 | B2 * | 5/2017 | Slessman | H05K 7/20836 |
| 9,670,689 | B2 * | 6/2017 | Dechene | E04H 5/02 |
| 9,790,701 | B2 * | 10/2017 | Ziegler | E04H 5/02 |
| 9,814,160 | B2 * | 11/2017 | Slessman | H05K 7/2079 |
| 9,857,089 | B2 * | 1/2018 | Slessman | H05K 7/20745 |
| 9,907,212 | B2 * | 2/2018 | Parizeau | H05K 7/20745 |
| 9,986,652 | B1 * | 5/2018 | Roy | G06F 1/20 |

FOREIGN PATENT DOCUMENTS

CN 106982543 A * 7/2017
CN 207350637 U * 5/2018

* cited by examiner

*Primary Examiner* — Robert J Hoffberg
(74) *Attorney, Agent, or Firm* — Womble Bond Dickinson (US) LLP

(57) ABSTRACT

A data center system includes a multi-floor housing having a first floor and a second floor housings which house a number of electronic racks of information technology (IT) components operating therein. The system includes a first set of indirect evaporative cooling units (IDECs) coupled to a first portion of the multi-floor housing through a first side of the multi-floor housing to direct exterior air through heat exchangers of corresponding IDECs to cool a first portion of interior air which cools a first set of the electronic racks. The system includes a second set of IDECs coupled to a second portion of the multi-floor housing through a second side of the multi-floor housing to direct exterior air through heat exchangers of corresponding IDECs to cool a second portion of interior air which cools a second set of the electronic racks. The system includes various DEC couplings/layouts and air flow management.

15 Claims, 12 Drawing Sheets

COUPLING DESIGNS FOR A DATA CENTER BUILDING USING INDIRECT EVAPORATIVE COOLING (IDEC) UNITS

FIELD OF THE INVENTION

Embodiments of the present invention relate generally to data centers. More particularly, embodiments of the invention relate to coupling designs for data center buildings using indirect evaporative cooling/cooler (IDEC) units.

BACKGROUND

Heat removal is a prominent factor in computer system and data center design. The number of servers deployed within a data center has steadily increased as server performance has improved, thereby increasing the amount of heat generated during the regular operation of the servers. The reliability of servers used within a data center decreases if the environment in which they operate is permitted to increase in temperature over time. A significant portion of the data center's power is used for cooling electronics at the server level. As the number of servers within a data center increase, a greater portion of the power is commensurately consumed by the data center to cool electronic components within the servers.

Indirect evaporative cooling/cooler (IDEC) is a popular cooling solution for data centers. IDEC uses exterior air to cool interior air of the data center through air-to-air heat exchangers. In addition, IDEC uses evaporative cooling (i.e., the temperature of a parcel of air is cooled by evaporation of water into it) when ambient air dry-bulb temperature (the temperature of freely exposed air) is not sufficiently low. Furthermore, IDEC can use direct expansion cooling during extreme ambient temperature conditions. In addition, the architecture of IDEC solution can be simple, but more reliable.

However, when IDECs are used for data center buildings with multiple floors, several challenges, such as leakage, weight requirements, and complex air duct designs, arise for both a perimeter installation and a roof installation, especially in the cases which multiple floors are designed for IT data center rooms and each of the floors requires cooling from several IDEC units.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
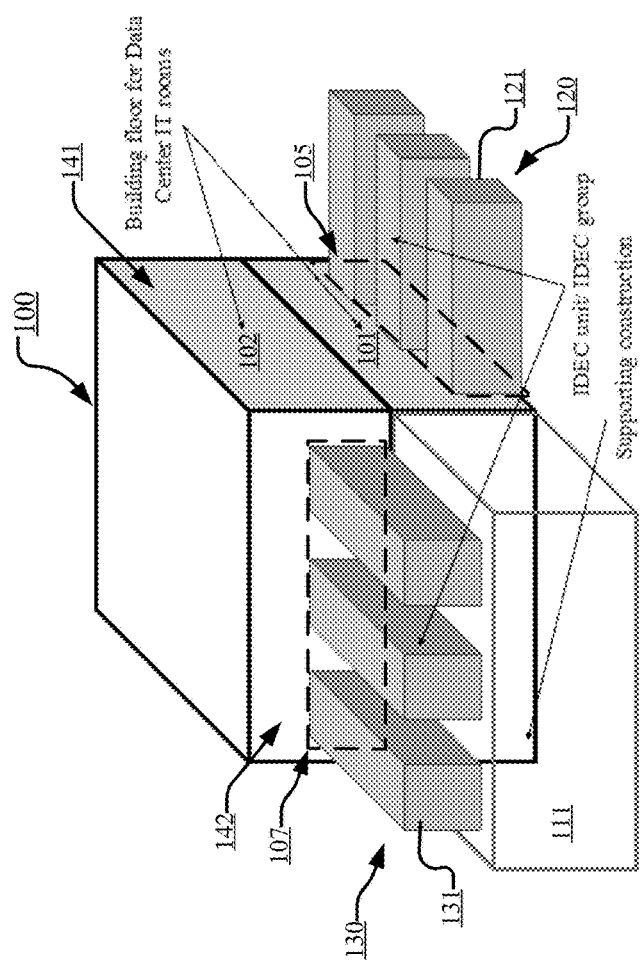
FIG. 1 illustrates an example of IDEC units disposed on adjacent sides of a data center building according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, a data center system includes a multi-floor housing having a first floor housing and a second floor housing, where the first floor housing and the second floor housing house, respectively, a number of electronic racks of information technology (IT) components operating therein, including a first set of electronic racks disposed within the first floor housing and a second set of electronic racks disposed within the second floor housing. The system includes a first set of one or more heat-removing indirect evaporative cooling/cooler (IDEC) units, each of the DEC units of the first set is coupled to a first portion of the multi-floor housing through a first side of the multi-floor housing to direct exterior air through an air-to-air heat exchanger of the corresponding DEC unit to cool a first portion of interior air, where the first portion of the interior air is directed to cool the first set of electronic racks. The system includes a second set of one or more (IDEC) units, each of the IDEC units of the second set is coupled to a second portion of the multi-floor housing through a second side of the multi-floor housing to direct exterior air through an air-to-air heat exchanger of the corresponding IDEC unit to cool a second portion of interior air, where the second portion of the interior air is directed to cool the second set of electronic racks and the first side is a different side than the second side of the multi-floor housing.

In one embodiment, the first set or the second set of the one or more IDEC units are laid out either parallel or perpendicular to the first side or the second side of the multi-floor housing. In one embodiment, the first set of the one or more IDEC units is situated at a location that does not overlap vertically with a location of the second set of the one or more IDEC units so exterior air entering or exiting from the air-to-air heat exchangers of the one or more IDEC units of the first set do not overlap exterior air entering or existing from the air-to-air heat exchangers of the one or more IDEC units of the second set.

In one embodiment, the first portion of the multi-floor housing is situated at a first floor housing of the multi-floor housing and the second portion of the multi-floor housing is situated at a second floor housing of the multi-floor housing. In another embodiment, the second floor is one floor above the first floor and the second set of the one or more IDEC units is placed on a support structure that can reach the one floor above the first floor. In another embodiment, the second floor is two floors above the first floor and the second set of the one or more IDEC units is placed on a support structure that can reach the two floors above the first floor, where the first set of the one or more IDEC units is at a location that overlaps vertically with a location of the second set of the one or more IDEC units and exterior air entering or exiting from the air-to-air heat exchange of the one or more IDEC units of the first set minimally overlaps exterior air entering or exiting from the air-to-air heat exchange of the one or more IDEC units of the second set.

In one embodiment, an air flow management of the first floor housing of the multi-floor housing is separate from an air flow management of the second floor housing of the multi-floor housing. In another embodiment, each of the first floor housing and the second floor housing of the multi-floor housing includes a hot air enclosure space. In another embodiment, the hot air enclosure space of the first floor housing is shared with the hot air enclosure space of the second floor housing. In another embodiment, each of the first floor housing and the second floor housing of the multi-floor housing includes a cold air enclosure space. In another embodiment, the cold air enclosure space of the first floor housing is shared with the cold air enclosure space of the second floor housing.

In one embodiment, the first side and the second side are adjacent sides. In one embodiment, the first side and the second side are opposite sides. In one embodiment, the second portion of the multi-floor housing is a ceiling return portion of the multi-floor housing and the second set of one or more IDEC units are coupled to a ceiling return of the multi-floor housing. In one embodiment, each of the first set or the second set of electronic racks of IT components are disposed in aisles to form alternating hot and cold air aisles to direct an air flow to the IT components of the first set or the second set of electronic racks respectively.

Although the below figures illustrate data center systems having a two-floor rectangular building, however, it should be noted that a data center building and/or housing can include multiple floors with exterior perimeters of various shapes such as polygonal, circular, and/or oval, etc.

FIG. 1 illustrates an example of IDEC units disposed on adjacent sides of a data center building according to one embodiment. Referring to FIG. 1, in one embodiment, data center system or data center building 100 includes a two-floor housing which includes first floor housing 101 and second floor housing 102. First floor housing 101 is coupled to a first set (or group) of IDECs 120 which includes one or more IDEC units 121. Second floor housing 102 is coupled to a second set (or group) of IDECs 130 which includes one or more IDEC units 131. The first set of IDECs 120 is coupled to building floor 101 through portion 105 on side 141 of data center 100. The second set of IDECs 130 is coupled to building floor 102 through portion 107 on side 142 of data center 100. The second set of IDECs 130 is supported by supporting structure 111 near side 142 for the one or more IDEC units 131 of the second set to reach a second floor of data center 100. Here, both the first set and the second set of IDECs 120-130 are disposed perpendicular to respective sides (e.g., sides 141, 142) of the data center 100 and side 141 is adjacent to side 142. Although, second floor housing 102 is illustrated as one floor above first floor housing 101, in other embodiment, second floor housing 102 can be several floors (e.g., two, three, or four floors, etc.) above first floor housing 101.

Figure 2:
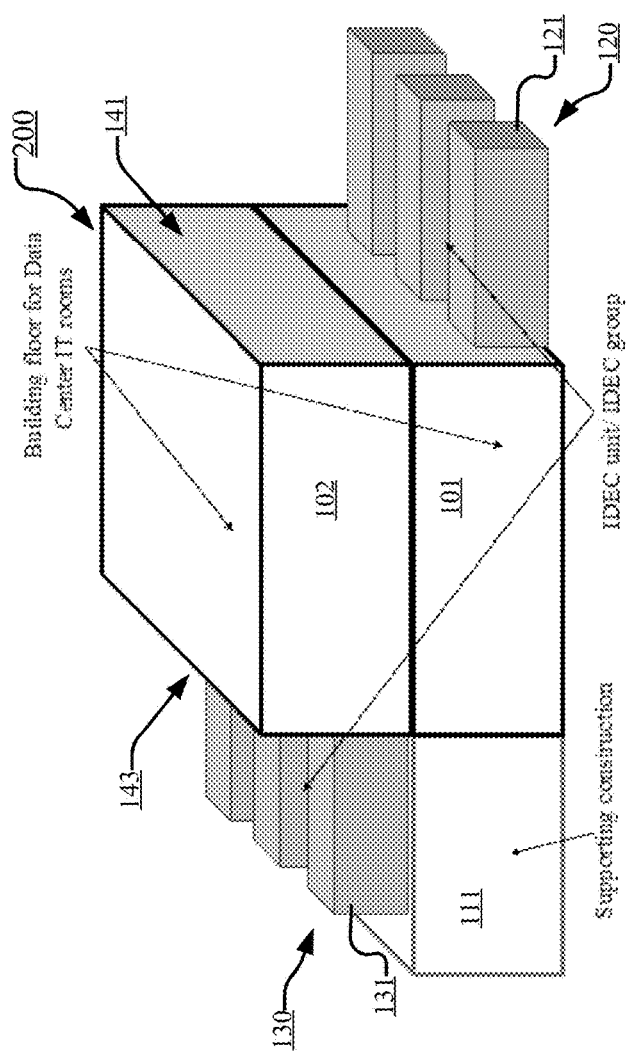
FIG. 2 illustrates an example of IDEC units disposed on opposite sides of a data center building according to one embodiment.

FIG. 2 illustrates an example of IDEC units disposed on opposite sides of a data center building according to one embodiment. Referring to FIG. 2, data center 200 can be similar to data center 100. Data center 200, in one embodiment, includes the second set of IDECs 130 coupled to second floor housing 102 via side 143 of data center 100. Here, side 143 is opposite to side 141. The second set of IDECs 130 includes IDEC units 131 supported by supporting structure 111 situated near side 143 of data center 200 so IDEC units 131 can reach second floor housing 102.

Figure 3:
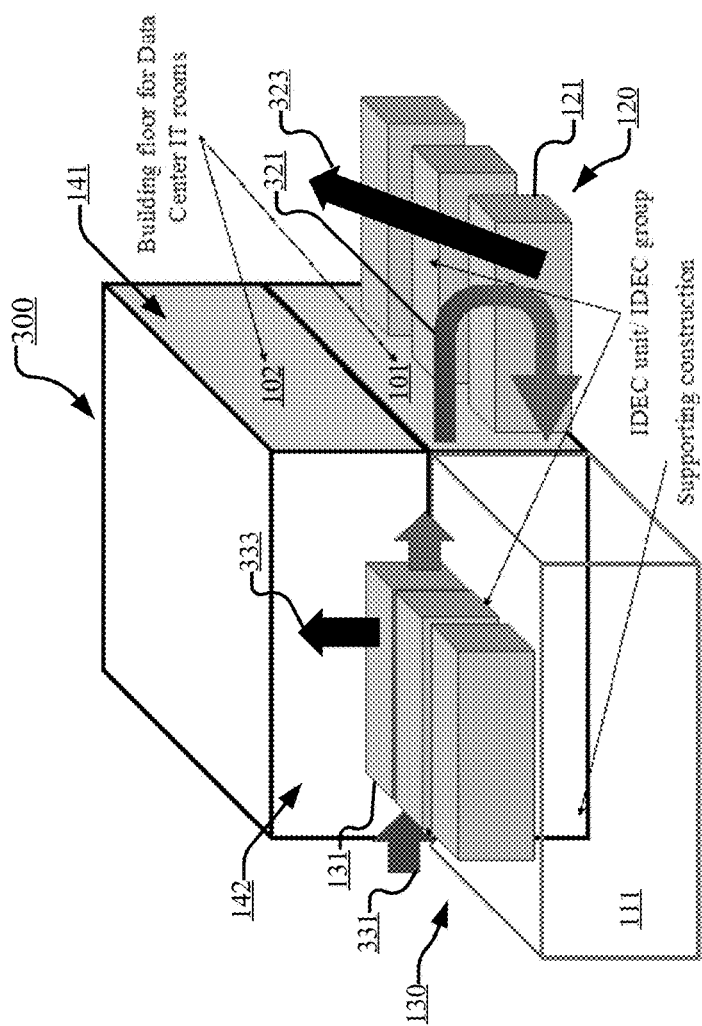
FIGS. 3-4 illustrate examples of alignments of IDEC units for a data center according to some embodiments.
Figure 4:
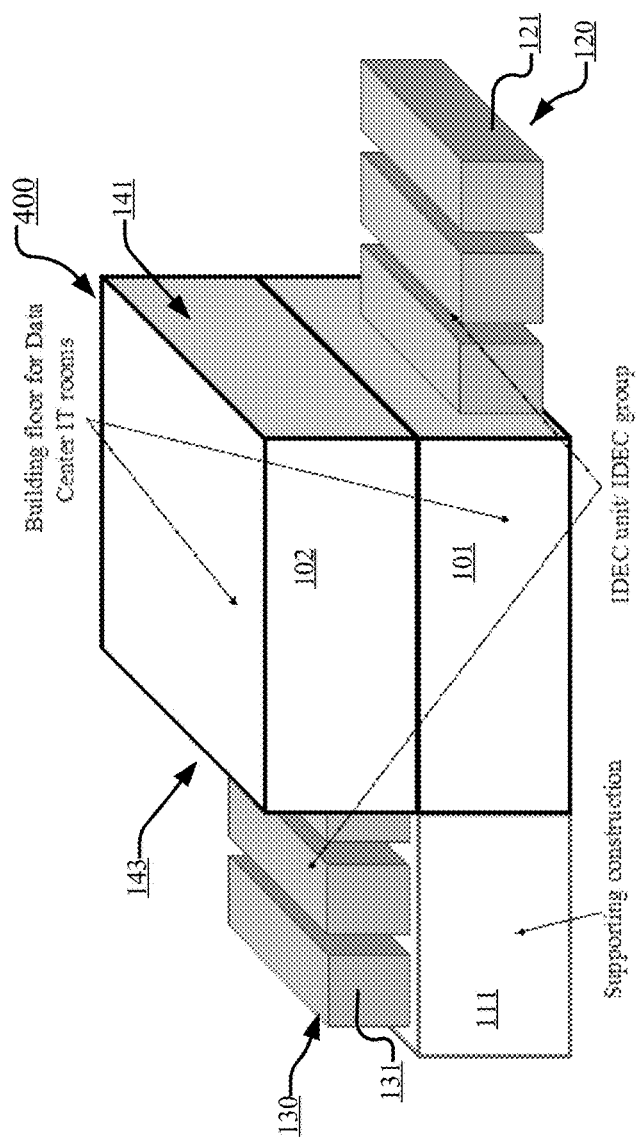

FIGS. 3-4 illustrate examples for different IDEC unit alignments for a data center according to some embodiments. IDEC units typically have fixed internal air flow designs within the unit. The air flow designs usually depend on a layout of a heat exchanger unit within the IDEC unit. In one embodiment, some IDEC units of the data center have both air supply and return on a same side of the respective IDEC units (such as IDEC unit 121 of FIG. 3). In another embodiment, some IDEC units of the data center have air supply and return on opposing sides of the respective IDEC units (such as IDEC 131 of FIG. 3). Here, external air ducts may be used to direct air return to the opposing side for the respective IDEC units.

Referring to FIG. 3, data center 300 can be similar to data center 100 of FIG. 1. In one embodiment, data center 300 includes a first set of IDECs 120 and a second set of IDECs 130. The first set of IDECs 120 are aligned perpendicular to side 142 of data center 300, while the second set of IDECs 130 are aligned parallel to side 142 of data center 300. Referring to FIG. 3, in one embodiment, perpendicular aligned IDEC units, such as IDEC unit 121, can direct interior air flow 321 via one or more air ducts (not shown) coupled to first floor housing 101. Interior air flow 321 can carry heat, dissipated from one or more IT components of electronic racks disposed within first floor housing 101, to air-to-air heat exchanger (not shown) of IDEC unit 121. IDEC unit 121 then directs exterior air flow 323 through the air-to-air heat exchanger(s) of IDEC unit 121 to carry heat away from air flow 321. The cooled air flow 321 then returns to first floor housing 101 via one or more air ducts (not shown) to cool electronics racks operating within the first floor housing 101.

In one embodiment, parallel aligned IDEC units, such as IDEC unit 131, can direct interior air flow 331 via one or more air ducts (not shown) coupled to second floor housing 102. Interior air flow 331 can carry heat, dissipated from one or more IT components of electronic racks disposed within second floor housing 102, to air-to-air heat exchanger(s) (not shown) of IDEC unit 131. IDEC unit 131 then directs exterior air flow 333 through the air-to-air heat exchanger(s) of IDEC unit 131 to carry heat away from air flow 331. The cooled air flow 331 then returns to second floor housing 102 via one or more air ducts (not shown) to cool electronics racks operating within the second floor housing 102.

Referring to FIG. 4, data center 400 can be similar to data center 300 of FIG. 3. In one embodiment, data center 400 includes a first set of IDECs 120 aligned parallel to side 141 of data center 400 and a second set of IDECs 130 aligned parallel to side 143 of data center 400. IDECs 120 provide a cooling for first floor housing 101 while IDECs 130 provide a cooling for second floor housing 102. In some embodiments, IDECs 120 and/or IDECs 130 provide a cooling for first floor housing 101 and IDECs 120 and/or IDECs 130 provide a cooling for second floor housing 102.

As shown in FIGS. 3-4, different alignments (e.g., parallel and perpendicular alignments) of DEC units 120-130 allow flexibilities for integration of different IDEC designs, different coupling (e.g., air duct placements) for the different IDEC designs, and different air management (e.g., ceiling return or wall return shown in FIGS. 5-6 below) configurations of the data centers. For example, perpendicular aligned IDECs may be better for cooling an air flow at one side of a data center building which IDECs are attached to, while parallel aligned IDECs may be better for cooling an air flow perpendicular to a side of the data center building which IDECs are attached to.

Figure 5:
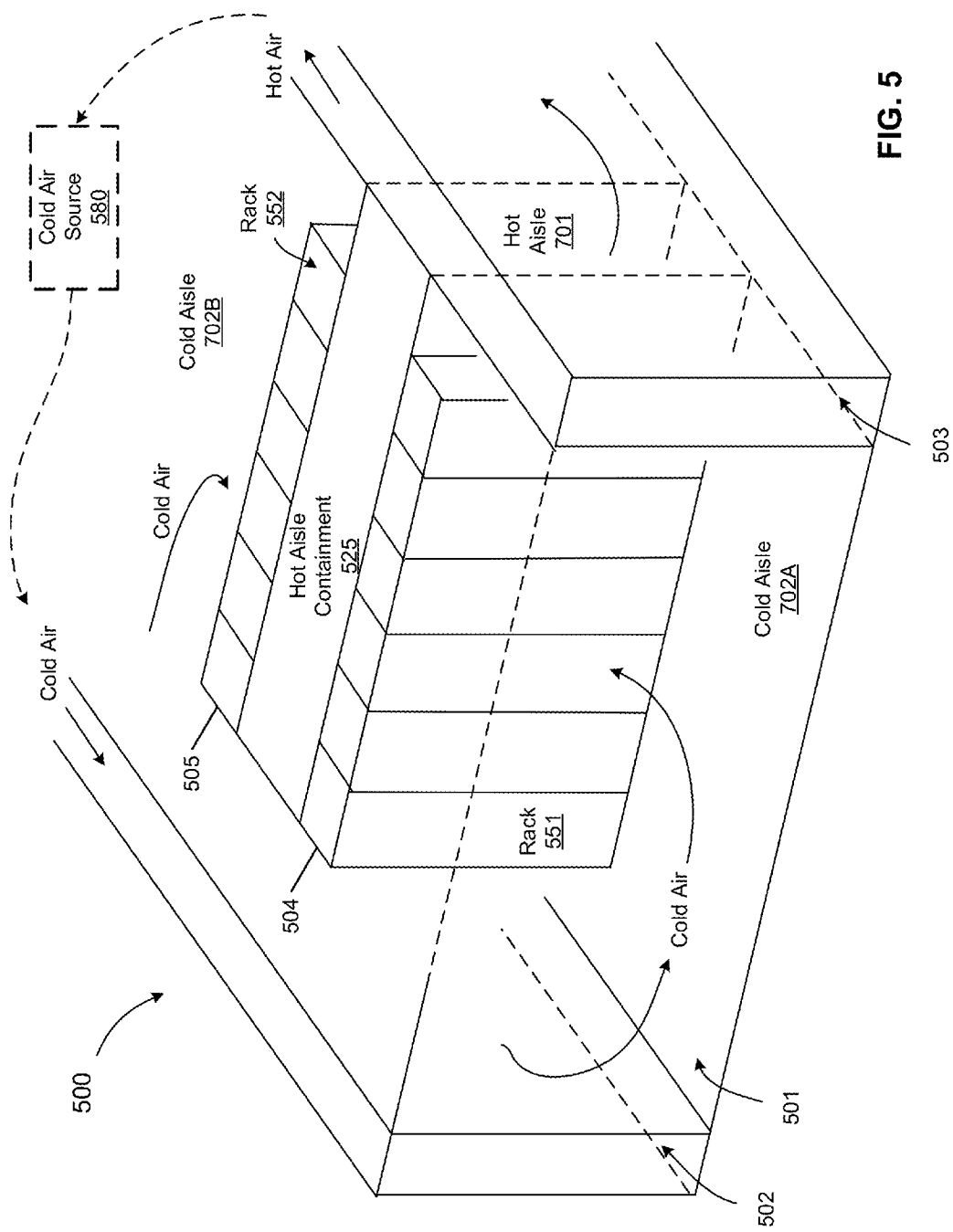
FIG. 5 shows a perspective view of a data center system according to one embodiment.

FIG. 5 shows a perspective view of a data center system according to one embodiment. Referring to FIG. 5, data center system 500 includes an IT room 501, a cold air room 502, and a hot air room 503. IT room 501 includes a number of electronic racks such as electronic racks 551-552. Each electronic rack contains one or more IT components arranged in a stack. An IT component can be a computer server providing data services to clients. Alternatively an IT component can be a peripheral device or a network appliance device such as cloud storage systems. Each IT component may include one or more processors, memory, and/or a storage device that may generate heat during operations. The electronic racks are arranged in a number of rows of electronic racks, in this example, rows 504-505 of electronic racks. The rows of electronic racks are arranged spaced apart to form one or more cold aisles and one or more hot aisles. In this embodiment, although there are only two rows 504-505 of electronic racks shown, there can be more rows to be contained in IT room 501.

In one embodiment, each row of electronic racks is positioned or sandwiched between a cold aisle and a hot aisle. In this example, row 504 and row 505 are positioned apart from each other to form cold aisle 702A, hot aisle 701, and cold aisle 702B. Hot aisle 701 is formed between row 504 and row 505. Row 504 is positioned or sandwiched between cold aisle 702A and hot aisle 701, while row 505 is positioned or sandwiched between cold aisle 702B and hot aisle 701. In one embodiment, hot aisle 701 is contained or enclosed by hot aisle containment (or container or other enclosures). In another embodiment, the cold aisles are contained in a containment environment instead of the hot aisles. In a further embodiment, both hot aisles and cold aisles are contained in an enclosed environment. In one embodiment, the backend of the electronic racks of rows 504-505 are facing hot aisle 701, while the frontends of the electronic racks are facing cold aisle 702A or cold aisle 702B and away from hot aisle 701.

In one embodiment, cold air room 502 is located and adjacent to a first side of IT room 501, while hot air room 503 is located and adjacent to a second side of IT room 501. In this example, the first side and the second side are opposite sides of IT room 501. Cold air room 502 is configured to receive cold air or cool air via one or more inlet ports from a cold air source such as cold air source 580. The cold air is allowed to enter IT room 501 from cold air room 502 via one or more openings disposed on the wall between cold air room and IT room 501 (not shown). The cold air entering IT room 501 to form cold aisles 702A-702B.

Hot air room 503 is configured to exhaust the hot air from hot aisle 701 and return the hot air or warmer air back to the cold air source for heat exchange. Note that cold air source 580 can include a heat exchanger or chiller. For example, cold air source 580 can be an DEC system or device. Alternatively, cold air source 580 can simply be the natural ambient air outside of the data center system 500.

An evaporative cooler is a device that cools air through the evaporation of water. Evaporative cooling differs from typical air conditioning systems, which use vapor compression or absorption refrigeration cycles. Evaporative cooling works by exploiting water's large enthalpy of vaporization. The temperature of dry air can be dropped significantly through the phase transition of liquid water to water vapor (evaporation). Direct evaporative cooling is used to lower the temperature and increase the humidity of air by using latent heat of evaporation, changing liquid water to water vapor. In this process, the energy in the air does not change. Warm dry air is changed to cool moist air. The heat of the outside air is used to evaporate water. Indirect evaporative cooling is a cooling process that uses direct evaporative cooling in addition to some type of heat exchanger to transfer the cool energy to the supply air. The cooled moist air from the direct evaporative cooling process never comes in direct contact with the conditioned supply air.

Referring back to FIG. 5, in this example, the cold air is received from one or more inlets or inlet ports disposed on a wall of cold air room 502, where the wall is substantially parallel with a third side of IT room 501. The third side of IT room 501 is substantially perpendicular to the first side and the second side, while the first side and the second side are substantially parallel to each other. Similarly, the hot air is exhausted from hot air room 503 to the external environment or back to cold air source 580 via one or more outlets or outlet ports disposed on a wall of hot air room 502, where the wall is substantially parallel with the third side of IT room 501.

According to one embodiment, hot aisle 701 is enclosed or contained within hot aisle containment 525, such that the hot air cannot escape or spill from hot aisle 701 into other areas of IT room 501 such as cold aisles 702A-702B. Instead, the hot aisle connects to hot air room 503 via one or more openings disposed on a wall between hot aisle 701 and hot air room 503. In one embodiment, the openings may include one or more doors to allow an operator or a user to enter hot aisle 701 from hot air room 503 to access the backend of the electronic racks, for example for maintenance services. Similarly, the openings disposed on the wall between cold air room 502 and IT room 501 may include one or more doors to allow an operator or user to enter cold aisles 702A-702B from cold air room 502. As a result, entering or leaving cold aisles or hot aisles would not have a significant impact on the cold air distribution and hot air exhaustion. That is, entering or leaving hot aisle 701 would not alter cold air distribution for cold aisles 702A-702B, because hot aisle 701 is separated from cold aisles 702A-702B and the rest of IT room 501 by hot aisle containment 525. Similarly, entering or leaving cold aisles 702A-702B would not affect hot air exhaustion of hot aisle 701, since opening a door for a user to enter or leave would not mix the cold air and the hot air.

Figure 6A:
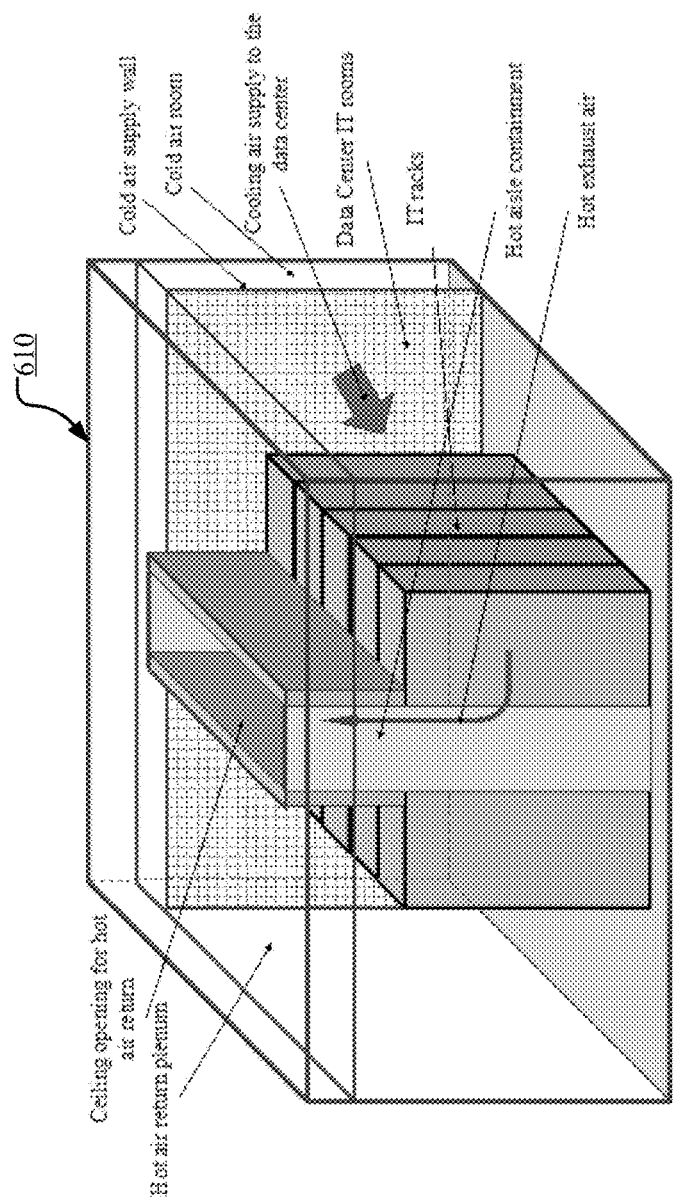
FIG. 6A illustrates an example of an air flow management design having a wall supply and a ceiling return according to one embodiment.

FIG. 6A illustrates an example of an air flow management design having a wall supply and a ceiling return according to one embodiment. Referring to FIG. 6A, floor housing 610 can be first floor housing 101 or second floor housing 102 of FIGS. 1-4. In one embodiment, floor housing 610 includes a supply wall separating a cold air room (or an enclosure space) and a data center IT room. The data center IT room can include sets of electronic IT racks operating therein, and one or more hot aisle(s) formed by the sets of electronic IT racks. In one embodiment, hot air leaves the back side of the sets of IT racks and enters a hot air return plenum (or hot air return ceiling room) via a ceiling opening. The hot air in the hot air return ceiling room then returns back to IDEC units which may be coupled through floor housing 610.

Figure 6B:
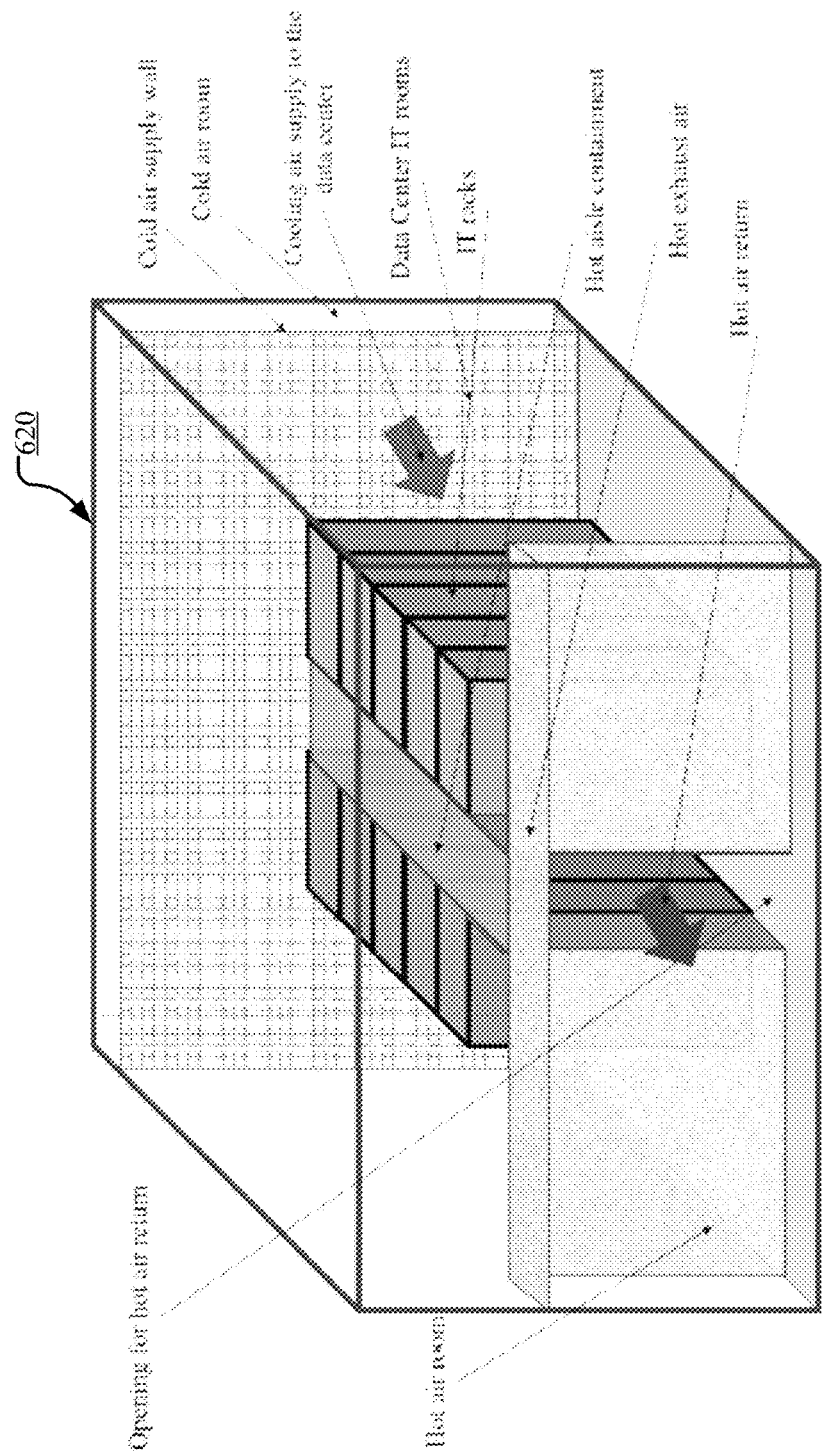
FIG. 6B illustrates an example of an air flow management design having a wall supply and a wall return according to one embodiment.

FIG. 6B illustrates an example of an air flow management design having a wall supply and a wall return according to one embodiment. Referring to FIG. 6B, floor housing 620 can be first floor housing 101 or second floor housing 102 of FIGS. 1-4. In one embodiment, floor housing 620 includes, on one side, a supply wall separating a cold air room (or a cold air enclosure space) and the data center IT room. The floor housing 620 includes a hot aisle containment (or a hot air room or hot air enclosure space) on a different side for hot air return. The cold air room and the hot air room are coupled to IDEC units through floor housing 620. Note the difference between floor housing 620 and floor housing 610 is a difference in hot air return paths, e.g., a hot air room on a side of floor housing 620 versus a hot air ceiling return of housing 610.

In some embodiments, each floor of a multi-floor housing for a data center is coupled to one set of IDEC units. An air flow management for the floor is independent from an air flow management of other floors of the multi-floor housing. In some embodiments, the air flow managements of different floors are shared.

Figure 7:
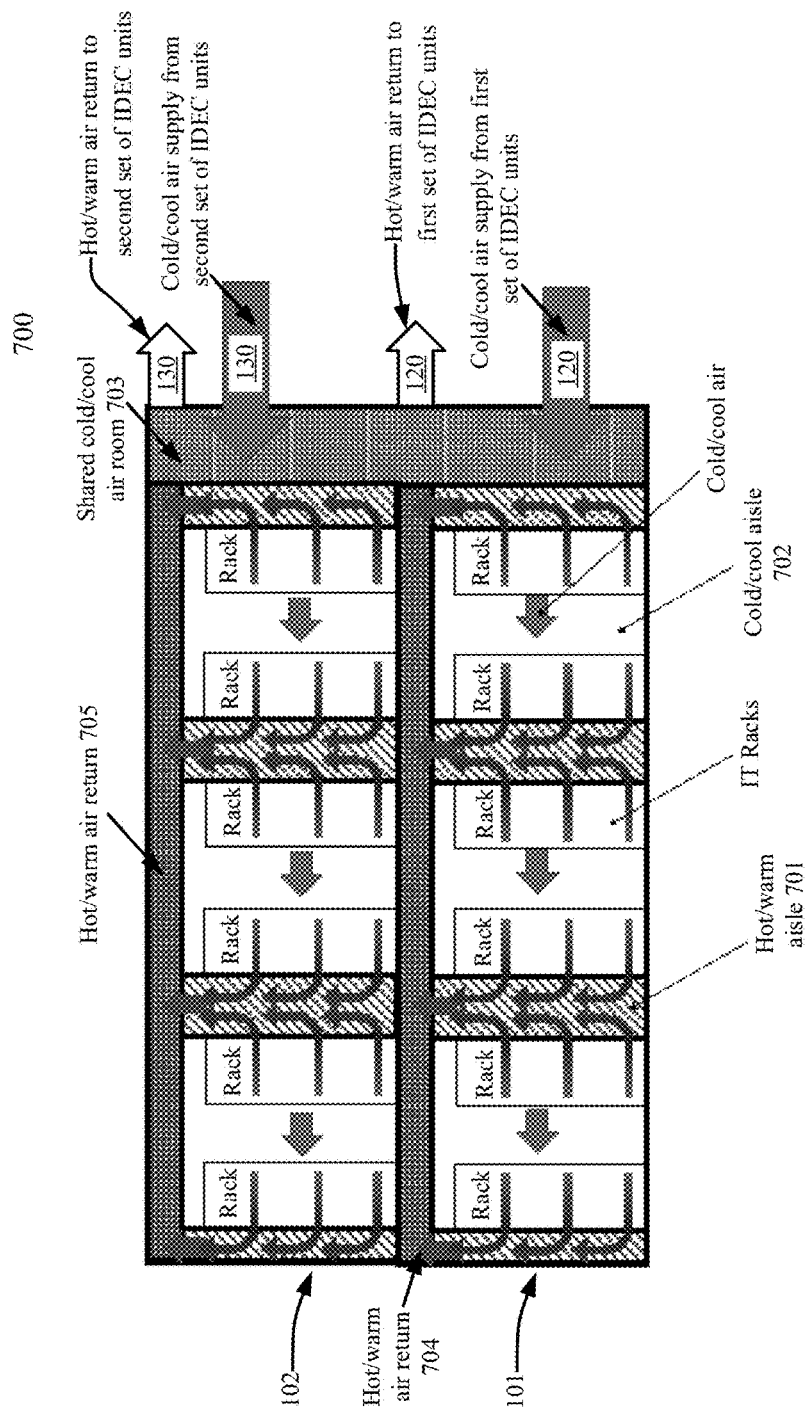
FIG. 7 illustrates a side view of a multi-floor data center system having a shared cold/cool air room at one side according to one embodiment.

FIG. 7 illustrates a side view of a multi-floor data center system having a shared cold/cool air room at one side according to one embodiment. Data center 700 can be any one of data centers 100-400 of FIGS. 1-4. Referring to FIG. 7, data center 700 may be housed by a multi-floor housing including first floor housing 101 and second floor housing 102. Each of the floor housings may house an IT room with electronic racks operating therein. The electronic racks may be spaced apart and positioned in rows to form hot/warm air aisle(s) 701 and cold/cool air aisle(s) 702. Cold/cool air aisle(s) 702 are supplied by a cooling air entering the first floor or the second floor IT rooms via one or more openings from shared cold/cool air room 703. The cold/cool air then enters from the frontends of the electronic IT racks, travels through the airspace of the electronic IT racks, and enters hot/warm aisle(s) 701. Hot/warm aisle(s) 701 are each enclosed or contained in a hot aisle containment structure for returning hot air to IDEC units via hot/warm air returns 704-705 (which are independent of each other) for the respective floors. There are air ducts connecting hot/warm air returns 704-705 and the first and the second sets of IDEC units 120-130 respectively. Shared cold air room 703 may be positioned on a side of data center 700 which is coupled to, and is supplied cold air by, both the first and the second sets of IDEC units 120 and 130. In one embodiment, the first set of IDEC units 120 is situated at a first side different from a second side where the second set of IDEC units 130 is situated. In another embodiment, the first side is an adjacent side of the second side (as shown in FIG. 1). In another embodiment, the first side is an opposite side of the second side (as shown in FIG. 2).

Figure 8:
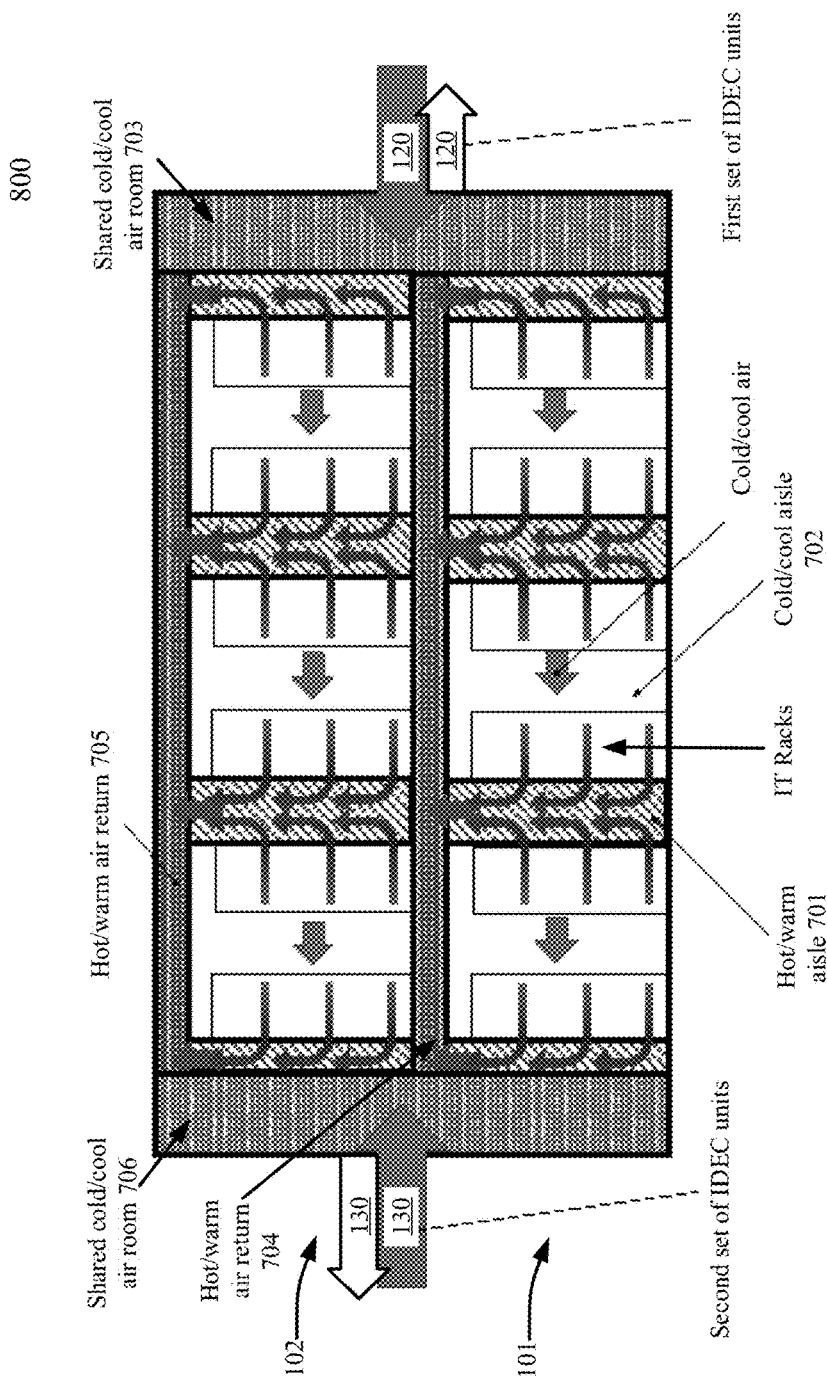
FIG. 8 illustrates a side view of a multi-floor data center system having shared cold/cool air rooms at two sides according to one embodiment.

FIG. 8 illustrates a side view of a multi-floor data center system having shared cold/cool air rooms at two sides according to one embodiment. Data center 800 can be any one of data centers 100-400 of FIGS. 1-4. Referring to FIG. 8, in one embodiment, data center 800 includes cold/cool air room 703 and 706 both of which shares cold/cool air for first floor housing 101 and second floor 102. Cold/cool air room 703 is supplied cold/cool air by a first set of IDEC units which is situated at one side of data center 800 while cold/cool air room 706 is supplied cold/cool air by a second set of IDEC units which is situated at another side of data center 800. Hot/warm aisle(s) 701 are enclosed or contained in a hot aisle containment structure for returning hot air to the first and the second sets of IDEC units 120-130 via independent hot/warm air returns 704-705 for the respective floors. In one embodiment, cold/cool air room 703 is situated on an opposite side of cold/cool air room 706. In another embodiment, cold/cool air rooms 703 and 706 may be arranged near adjacent sides.

Figure 9:
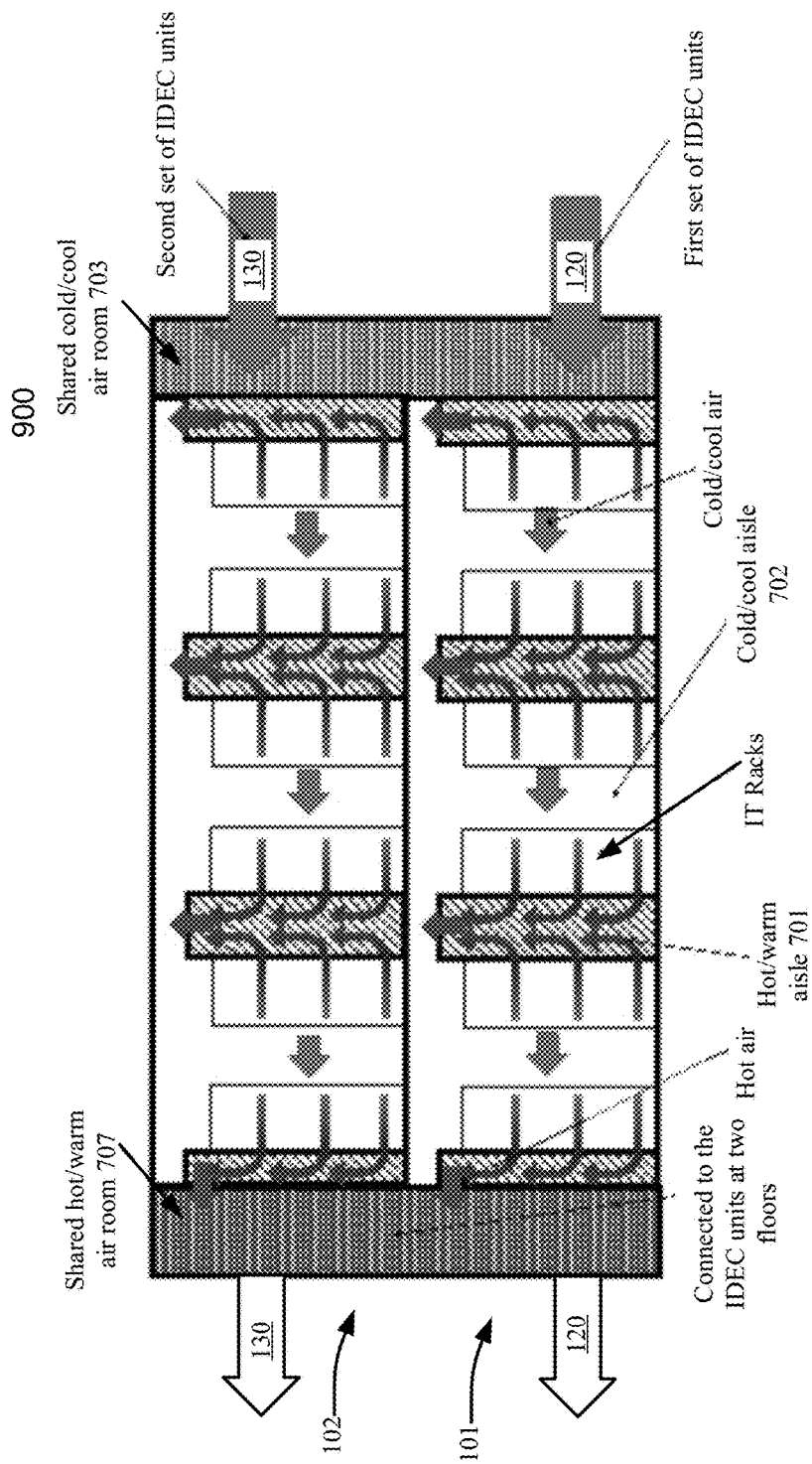
FIG. 9 illustrates a side view of a multi-floor data center system having a shared cold/cool air room at one side and a shared hot/warm air room at another side according to one embodiment.

FIG. 9 illustrates a side view of a multi-floor data center system having a shared cold/cool air room at one side and a shared hot/warm air room at another side according to one embodiment. Data center 900 can be any one of data centers 100-400 of FIGS. 1-4. Referring to FIG. 9, in one embodiment, data center 900 includes a shared cold/cool air room 703 sharing cold/cool air for first floor housing 101 and second floor 102 and a shared hot/warm air room 707 sharing hot/warm air for first floor housing 101 and second floor 102. Cold/cool air room 703 can supply cold/cool air via the first set and the second set of DEC units 120-130 and is situated at one side of data center 900 while hot/warm air room 707 is situated at another side of data center 900 and can return hot/warm air to the first set and the second set of IDEC units 120-130. In this embodiment, hot/warm aisles 701 and hot/warm air room 707 are directly connected. In one embodiment, cold/cool air room 703 is on opposites sides of hot/warm air room 707. In this case, the first set of IDEC units 120 and the second set of IDEC units 130 can be coupled in parallel configurations at opposite sides of data center 900 (as shown in FIG. 4) to provide for shared cold/cool air room 703 and shared hot/warm air room 707 on opposite sides of data center 900.

Figure 10:
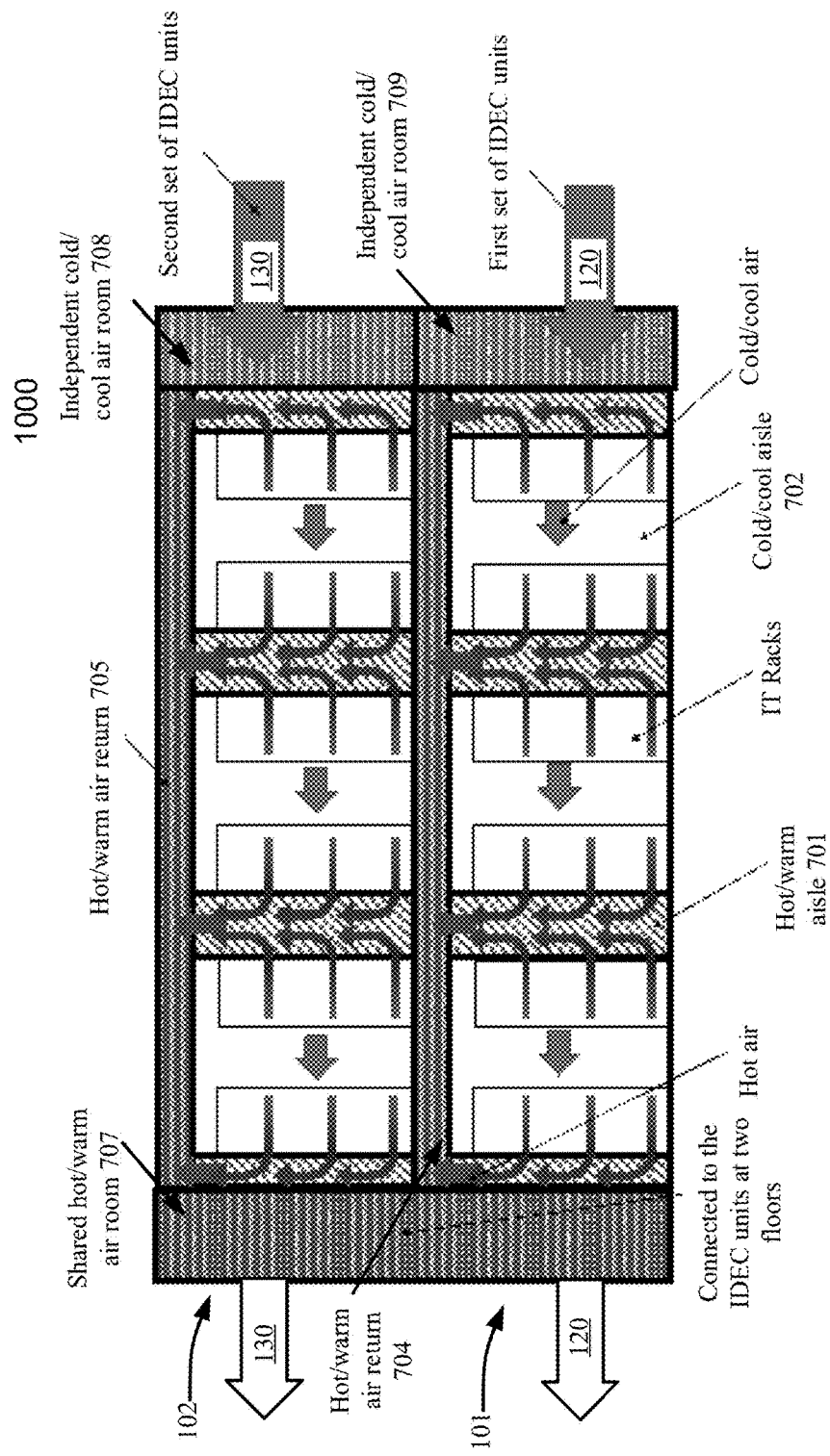
FIG. 10 illustrates a side view of a multi-floor data center system having independent cold/cool air rooms at one side and a shared hot/warm air room at another side having a ceiling return according to one embodiment.

FIG. 10 illustrates a side view of a multi-floor data center system having independent cold/cool air rooms at one side and a shared hot/warm air room at another side having a ceiling return according to one embodiment. Data center 1000 can be any one of data centers 100-400 of FIGS. 1-4. Referring to FIG. 10, in one embodiment, data center 1000 includes independent cold/cool air rooms 708-709 for first floor housing 101 and second floor 102, respectively, and a shared hot/warm air room 707 sharing hot/warm air for first floor housing 101 and second floor 102. Cold/cool air room 708 can supply cold/cool air via the first set of IDEC units 120 for the first floor housing 101 while cold/cool air room 709 can supply cold/cool air via the second set of IDEC units 130 for the second floor housing 102. For each of the floors, supplied cold/cool air from IDEC units enters cold/cool aisle 702, enters frontends of the electronic IT racks, travels through the airspace of the electronic IT racks, and enters hot/warm aisle(s) 701. Hot/warm aisle(s) 701 are each enclosed or contained in a hot aisle containment structure for returning hot/warm air to IDEC units via independent hot/warm air returns 704-705 for the respectively floors. The hot-warm air then enters shared hot/warm air room 707 and exits via the first set and/or the second set of IDEC units 120-130. In this case, similar to FIG. 9, the first set of IDEC units 120 and the second set of IDEC units 130 can be coupled in parallel configurations at opposite sides of data center 1000 (as shown in FIG. 4) to provide for independent cold/cool air rooms 708-709 and shared hot/warm air room 707 on opposite sides of data center 1000.

Figure 11:
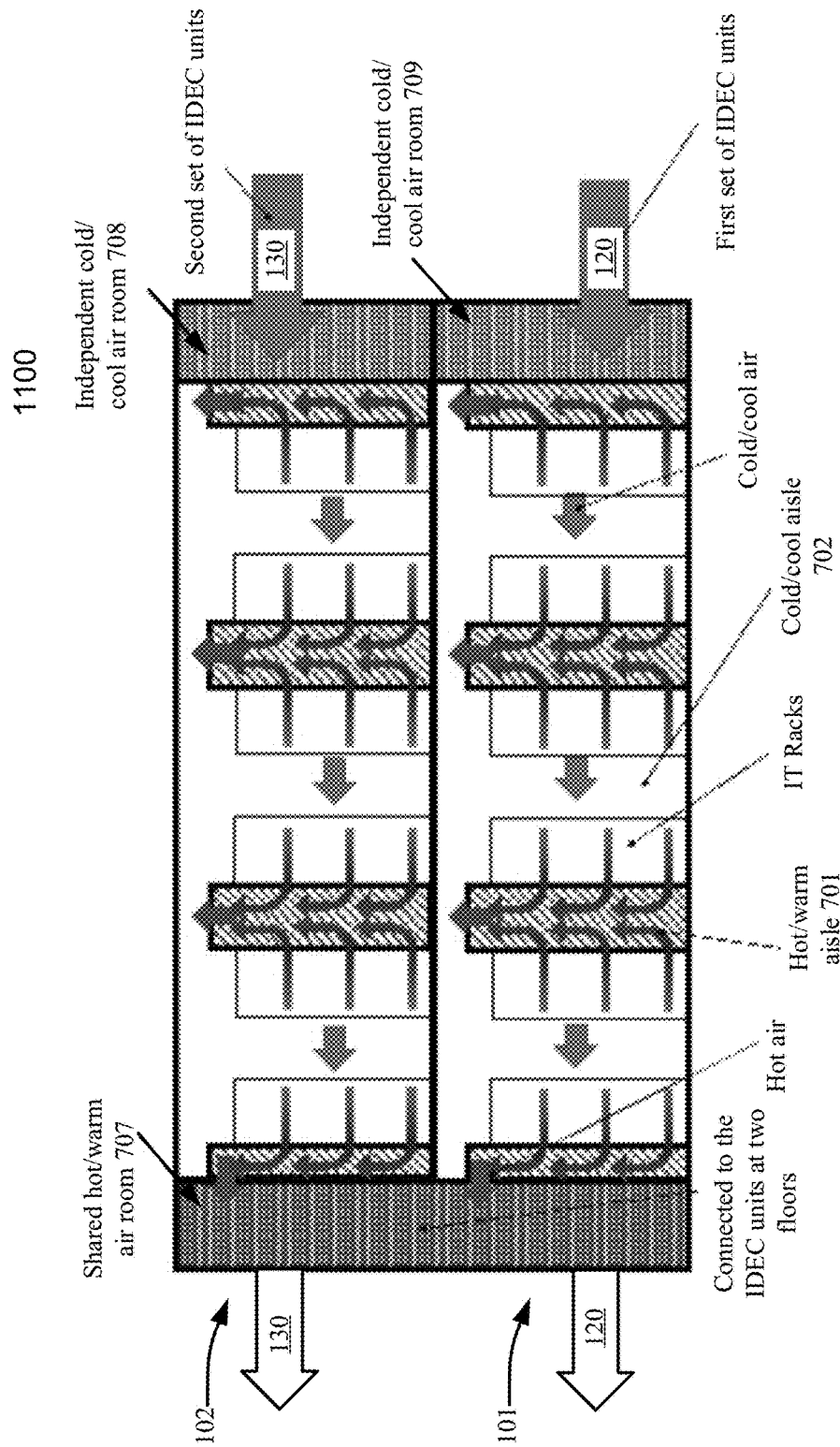
FIG. 11 illustrates a side view of a multi-floor data center system having independent cold/cool air rooms at one side and a shared hot/warm air room at another side having a wall return according to one embodiment.

FIG. 11 illustrates a side view of a multi-floor data center system having independent cold/cool air rooms at one side and a shared hot/warm air room at another side with a wall return according to one embodiment. Data center 1100 can be any one of data centers 100-400 of FIGS. 1-4. Here, data center 1100 is similar to data center 1000 of FIG. 10 except hot/warm air is returned to the sets of DEC units 120-130 via a wall return instead of a ceiling return. In some embodiments, one or more floors are wall returns while one or more of other floors of the multi-floor housing are ceiling returns.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

The invention claimed is:

1. A data center system, comprising:
   a multi-floor housing comprising:
      a first floor housing including a first set of electronic racks of information technology (IT) components operating therein, and
      a second floor housing including a second set of electronic racks of the IT components operating therein; and
   a plurality of heat-removing indirect evaporative cooling/cooler (IDEC) units, each of the IDEC units including an air-to-air heat exchanger; the plurality of IDEC units comprising:
      a first set of one or more of the IDEC units, each of the IDEC units of the first set is coupled to a first portion of the multi-floor housing through a first external side of the multi-floor housing to direct a first portion of exterior air through the air-to-air heat exchanger of a corresponding one of the one or more IDEC units of the first set to cool a first portion of interior air, wherein the first portion of the interior air is directed to cool the first set of electronic racks of the first floor housing; and
      a second set of one or more of the IDEC units, each of the IDEC units of the second set is coupled to a second portion of the multi-floor housing through a second external side of the multi-floor housing to direct a second portion of the exterior air through the air-to-air heat exchanger of the corresponding one of the one or more IDEC units of the of the second set to cool a second portion of the interior air, wherein the second portion of the interior air is directed to cool the second set of electronic racks of the second floor housing,
   wherein the first external side of the multi-floor housing is a different side than the second external side of the multi-floor housing, the first external side of the multi-floor housing does not have any of the one or more of the IDEC units of the second set, and the second external side of the multi-floor housing does not have any of the one or more of the IDEC units of the first set.

2. The data center system of claim 1, wherein at least one of:
   the first set of the one or more of the IDEC units are laid out either parallel or perpendicular to the first side of the multi-floor housing; or
   the second set of the one or more of the IDEC units are laid out either parallel or perpendicular to the second side of the multi-floor housing.

3. The data center system of claim 1, wherein the first set of the one or more of the IDEC units is situated at a location that does not overlap vertically with a location of the second set of the one or more of the IDEC units so the first portion of the exterior air entering or exiting from the air-to-air heat exchangers of the one or more of the IDEC units of the first set do not overlap the second portion of the exterior air entering or existing from the air-to-air heat exchangers of the one or more of the IDEC units of the second set.

4. The data center system of claim 1, wherein the first portion of the multi-floor housing is situated at substantially a same vertical height as the first floor housing of the multi-floor housing and the second portion of the multi-floor housing is situated at substantially a same vertical height as the second floor housing of the multi-floor housing.

5. The data center system of claim 4, wherein the second floor housing is one floor above the first floor housing and the second set of the one or more of the IDEC units is placed on a first support structure that reaches the one floor above the first floor housing.

6. The data center system of claim 5, wherein the multi-floor housing further comprises a third floor housing including a third set of electronic racks of the IT components operating therein;
   wherein the plurality of IDEC units further comprising a third set of one or more of the IDEC units, each of the IDEC units of the third set is coupled to a third portion of the multi-floor housing through the first external side of the multi-floor housing to direct a third portion of the exterior air through the air-to-air heat exchanger of a corresponding one of the one or more IDEC units of the third set to cool a third portion of the interior air, wherein the third portion of the interior air is directed to cool the third set of electronic racks of the third floor housing, and
   wherein the third floor housing is two floors above the first floor housing and the third set of the one or more of the IDEC units is placed on a second support structure that reaches the two floors above the first floor housing, wherein the first set of the one or more of the IDEC units is at a location that overlaps vertically with a location of the third set of the one or more of the IDEC units and the first portion of the exterior air entering or exiting from the air-to-air heat exchange of the one or more of the IDEC units of the first set minimally overlaps the third portion of the exterior air entering or exiting from the air-to-air heat exchange of the one or more of the IDEC units of the third set.

7. The data center system of claim 1, wherein a first air flow management of the first floor housing of the multi-floor housing is separate from a second air flow management of the second floor housing of the multi-floor housing.

8. The data center system of claim 7, wherein each of the first floor housing and the second floor housing of the multi-floor housing includes a hot air enclosure space.

9. The data center system of claim 8, wherein the hot air enclosure space of the first floor housing is shared with the hot air enclosure space of the second floor housing.

10. The data center system of claim 9, wherein each of the first floor housing and the second floor housing of the multi-floor housing includes a cold air enclosure space.

11. The data center system of claim 10, wherein the cold air enclosure space of the first floor housing is shared with the cold air enclosure space of the second floor housing.

12. The data center system of claim 1, wherein the first external side and the second external side are adjacent external sides.

13. The data center system of claim 1, wherein the first external side and the second external side are opposite external sides.

14. The data center system of claim 1, wherein the second portion of the multi-floor housing is a ceiling return portion of the multi-floor housing and the second set of one or more of the IDEC units are coupled to the ceiling return portion of the multi-floor housing.

15. The data center system of claim 1, wherein each of the first set or the second set of electronic racks of the IT components are disposed in aisles to form alternating hot and cold air aisles to direct an air flow to the IT components of the first set or the second set of the electronic racks respectively.

* * * * *